Figure 1:
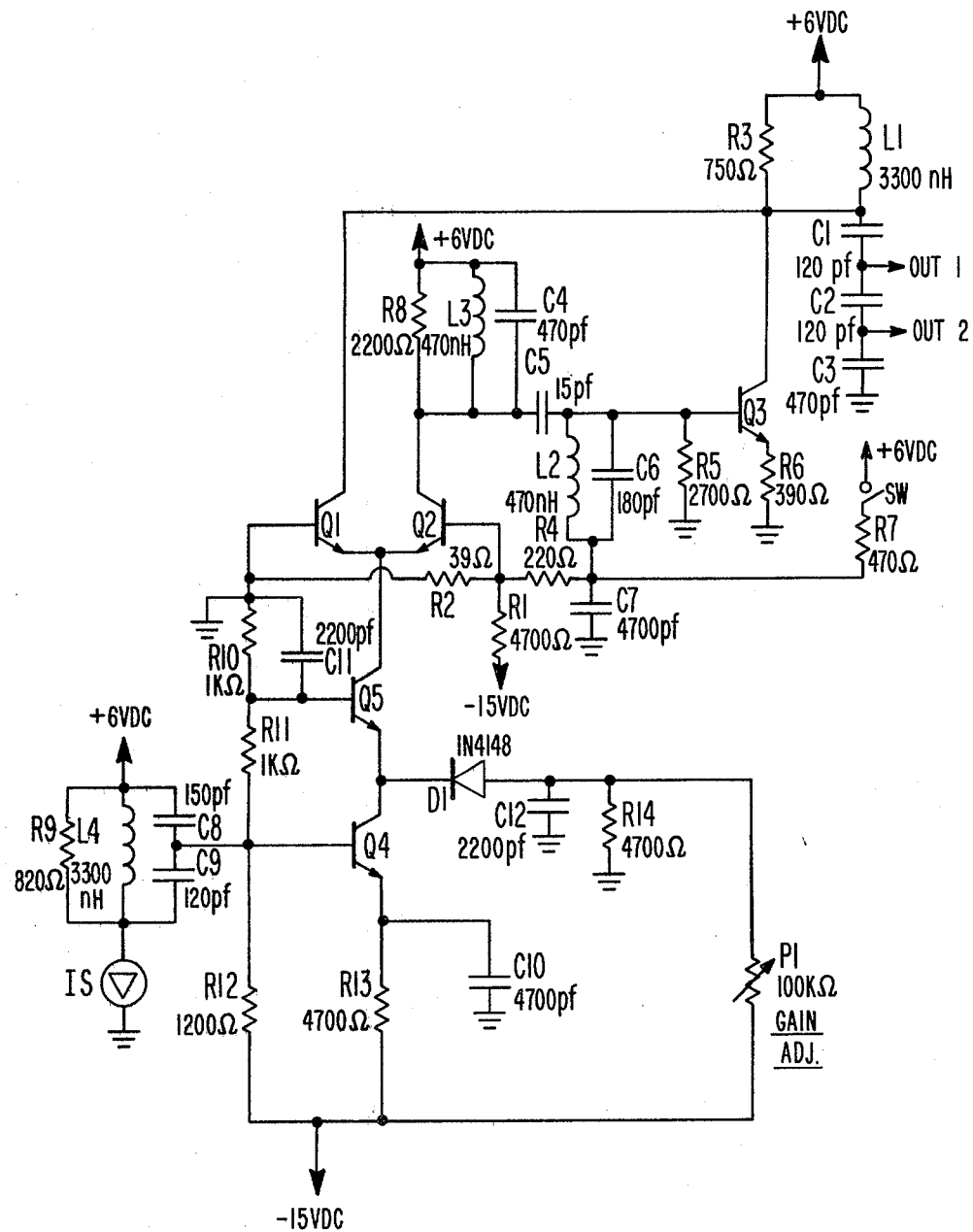
Figure 1:
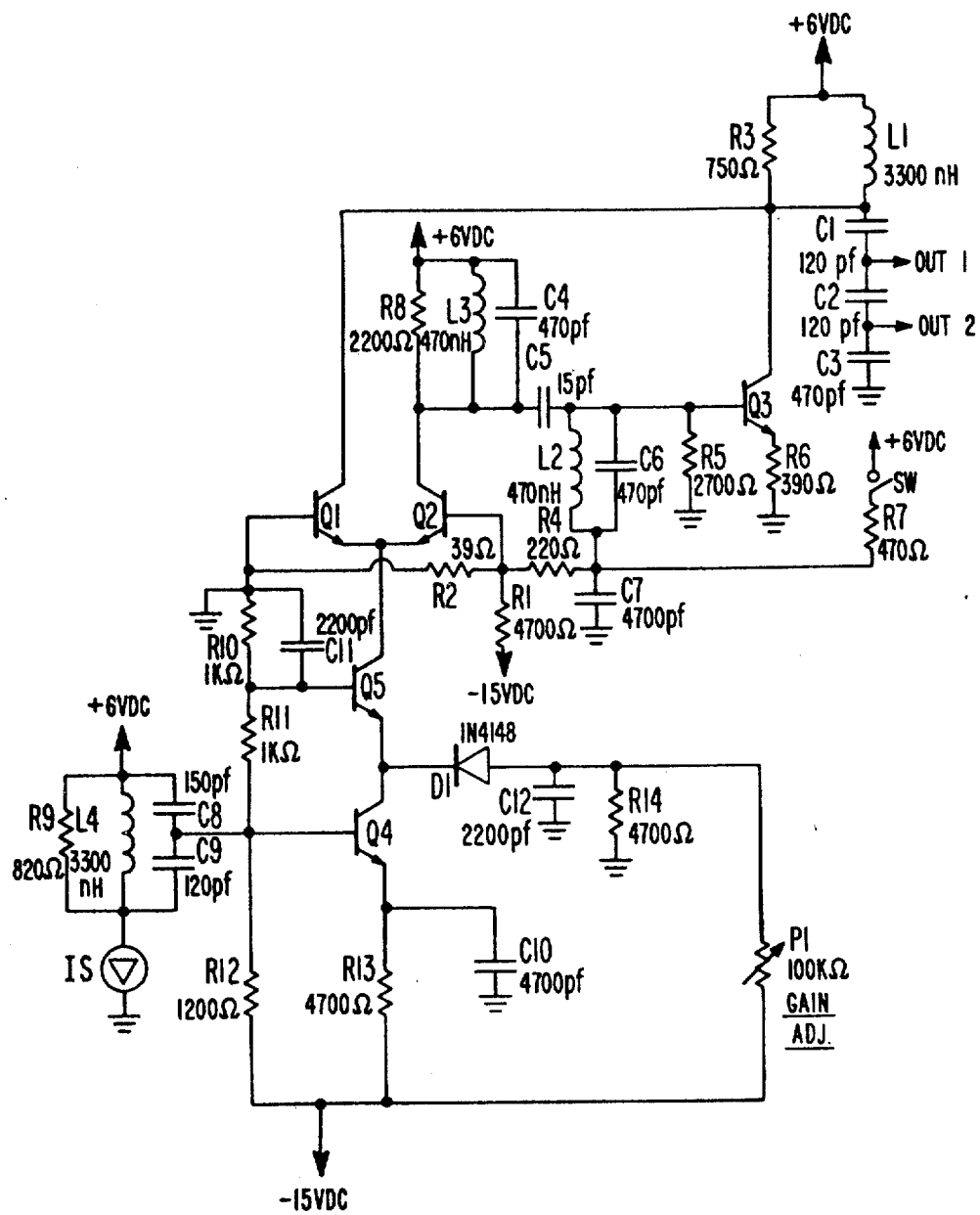

United States Patent [19]

Gamble

[11] 4,371,846
[45] Feb. 1, 1983

[54] BANDWIDTH CONTROL CIRCUITRY FOR RADAR I-F AMPLIFIER

[75] Inventor: Edward B. Gamble, Granada Hills, Calif.

[73] Assignee: Sperry Corporation, New York, N.Y.

[21] Appl. No.: 201,825

[22] Filed: Oct. 29, 1980

[51] Int. Cl.³ .................... H03H 3/68; H03G 3/30
[52] U.S. Cl. .................................. 330/278; 330/126; 330/295; 330/306; 330/311; 455/266
[58] Field of Search ............. 330/126, 252, 254, 261, 330/295, 306, 311, 278; 328/105, 106; 455/191, 188, 266

[56] References Cited

U.S. PATENT DOCUMENTS

| | | | |
|---|---|---|---|
| 2,716,161 | 8/1955 | Gray | 455/188 X |
| 3,260,952 | 7/1966 | Kaye et al. | 330/285 |
| 3,581,222 | 5/1971 | Dunwoodie | 330/284 |
| 3,649,847 | 3/1972 | Limberg | 328/171 X |
| 3,684,974 | 8/1972 | Solomon et al. | 330/254 |
| 3,742,126 | 6/1973 | Altmanshofer | 178/5.4 R |
| 3,872,387 | 3/1975 | Banach | 455/266 X |
| 3,875,522 | 4/1975 | Hoefi | 330/254 |
| 4,041,409 | 8/1977 | Kominami et al. | 330/254 |

OTHER PUBLICATIONS

"RCA Primus-90 WXD Receiver-Transmitter MI-585161 Component Maintenance Manual IB8029066", Dec. 1, 1979, pp. 21-25, 147-148.

Primary Examiner—James B. Mullins
Attorney, Agent, or Firm—Howard P. Terry

[57] ABSTRACT

A unidirectional current with i-f variations superimposed thereon is applied to the interconnected emitters of a pair of transistors, the collectors of which are coupled to a succeeding stage by a narrow-band filter and by a wide-band filter respectively. The unidirectional current with i-f variations is amplified by a selected one of the transistors and filtered accordingly, depending upon which of two polarities of potential is applied between the bases of the transistors.

7 Claims, 1 Drawing Figure

BANDWIDTH CONTROL CIRCUITRY FOR RADAR I-F AMPLIFIER

The present invention relates to bandwidth control circuitry for the intermediate-frequency (i-f) amplifier of a swept-scan ranging radar, whereby the bandwidth of the amplifier is decreased for long-distance ranging and increased for short-distance ranging.

The invention is particularly useful in performing the ground-mapping function in weather-scanning radars for aircraft, which otherwise normally function to determine the weather conditions along the proposed flight path. Such radars typically work in the X band (e.g., at 9345 MHz) with the radar receiver being a double-heterodyne type (e.g., with first local oscillator frequency of 9285 MHz, a 60 MHz center-frequency initial i-f amplifier chain, a second local oscillator of 49.3 MHz, and a 10.7 MHz center-frequency final i-f amplifier chain). Such a radar receiver is assumed to be used in connection with the specific embodiment of the invention to be described, wherein the bandwidth of the final i-f amplifier chain output is to be selectively changed, prior to its being applied to a logarithmic amplifier and detector for generating video response to be amplified and applied to the display cathode ray tube.

Insofar as the signal-to-noise of a radar receiver is concerned, the optimum bandwidth in MHz of the final i-f amplifier output is 1.2 divided by the duration in microseconds of the pulse echoed from the target. In performing the ground-mapping function the radar pulses encounter relatively small, solid targets which return the transmitted radar pulse in numerous well-defined echo pulses. The duration of each echo pulse is, except for Doppler effects, the same as that of the pulse sent by the radar; and in a ranging radar these Doppler effects are secondary and of no real concern, concern being with the time elapsed between the transmission of a pulse and the reception of the echo pulse return. This bandwidth allows the power in the primary spectra pulse to pass without significant reduction, while suppressing the noise in the still higher spectral regions.

In ground-mapping with radar it is desirable to use a transmitted radar pulse of relatively short duration for relatively short ranges (e.g., up to 50 miles), where one wishes to resolve relatively small targets with good ranging resolution. However, inasmuch as there is loss in pulse power as the square of the combined distance to target and back, it is desirable to increase the average power in the transmitted radar pulse for longer distances—e.g., by a 3:1 factor. This is normally accomplished by increasing the duration of the transmitted pulses. This can be done since, inasmuch as one is only interested in relatively large targets at such farther distances, one is willing to accept the attendant loss in ranging resolution.

Prior art i-f bandwidth control circuits have used low capacitance Schottky diodes to switch filter elements in the bandpass filter, but these diodes tend to be expensive. Furthermore, their use entails the use of bypass and d-c isolation capacitors and a buffer i-f amplifier stage following the variable bandwidth filter.

The present invention is embodied in a bandwidth control circuit that uses a pair of emitter-coupled transistors in a current steering arrangement, for selecting the application of an input current to a wide-band output filter either directly or via a narrow-band filter and amplifier cascade.

The sole FIGURE of the drawing shows a bandwidth control circuit embodying the present invention.

The selection of wideband or narrowband operation in this embodiment of the invention depends upon which of two NPN transistors Q1 and Q2 is conductive to direct, to its collector electrode, a unidirectional current with signal current variations applied to a node at which their emitter electrodes are interconnected. The base of Q1 is shown connected to ground reference potential.

If switch SW is open, $-15$ VDC as divided by the potential divider connection of resistors R1 and R2 is applied to the base of Q2. This results in Q1 and Q2 being biased for conduction and non-conduction respectively. Accordingly, Q1 applies collector current modulated by signal variations to the wide-bandwidth filter comprising the tank circuit connection of inductor L1 and the capacitance presented by serially connected capacitors C1, C2, and C3 parallelled by Q-reducing resistor R3. The resulting wideband response is made available at tap terminals OUT1 and OUT2 of the capacitive transformer formed by the series connection of C1, C2 and C3.

With switch SW open, the voltage at the base of Q2, slightly negative respective to ground potential, is divided again by the resistive potential divider action of resistors R4 and R5 (L2 being a short-circuit for d-c) to bias the base of an NPN transistor Q3 slightly negative respective to ground potential. Q3 has its emitter connected to ground potential via resistor R6, so the base-emitter junction of Q3 is slightly reverse-biased. This prevents the conduction of Q3, to remove from the wideband filter output any response to the noise internally generated in Q3 and any feedthrough through Q2 to the narrow bandwidth filter supplying the base of Q3. The simultaneous non-conduction of Q2 and Q3, when switch SW is open, thus provides double protection against feedthrough through the narrow bandwidth filter.

If switch SW is closed to apply $+6$ VDC to the end of resistor R7, current flows through R7 to be apportioned between resistors R4 and R5. Still considering L2 to be a short-circuit for d-c, R7 is in resistive potential divider relationship with the parallel connection of R5 with the series connection of R2 and R5, practically considered, insofar as determining the base potential (about $+2$ VDC) of Q3 is concerned. Q3 is conditioned to operate as a Class A common emitter amplifier with mid-band voltage gain of about 2 times, as determined by the ratio of the resistance of resistor R3 to that of resistor R6.

The $+2$ VDC is divided by the resistive potential divider action of R4 and R2 (R1 being sufficiently high in resistance compared to R2 that its effects on the potential division are of negligible consequence) to apply slight positive base bias to Q2. This results in Q2 being biased into conduction, and Q1, out of conduction. Accordingly, Q2 applies collector current modulated by signal variations to the input tuned circuit of a double-tuned narrow-band filter. This input tuned circuit comprises the tank circuit connection of an inductor L3 and a capacitor C4 as damped by resistor R8, and is top-coupled by capacitor C5 to an output tuned circuit which comprises the tank circuit connection of inductor L2 and a capacitor C6. This tank circuit is interposed between the base of Q3, to which it supplies signal, and a node by-passed to signal ground by capacitor C7 and is damped by the resistor R5. L2, L3, C4 and C6 are shown with nominal values in the drawing. In practice, provisions are generally made to tune the input tank circuit by adjusting L3 or C4 reactance and to tune the output tank circuit by adjusting L2 or C6 reactance. The narrow-band response of this narrow-band filter comprising R8, L3, C4, C5, L2, C6 and R5 is, then, applied to the base of common-emitter amplifier Q3. This amplifier supplies the mid-band voltage gain to make up the insertion loss of the narrow-band filter and to compensate for the effect on voltage gain of the change in the duration of the transmitted and echo radar pulses as between wide-band and narrow-band operation.

The one of the current steering transistors Q1 and Q2 selected for conduction is included in a cascade connection with NPN transistor Q4, Q4 being the common-emitter amplifier portion of the cascode, and the selected current steering transistor being the common-base amplifier portion of the cascode. The signal modulated current of the amplifier stage preceding this cascode, represented as flowing to a constant current generator IS, is filtered by a tank circuit comprising inductor L4 and the capacitive transformer connection of capacitors C8 and C9 that supplies signal to the base of Q4. Resistor R9 damps the tank circuit to broaden its bandwidth. The emitter of Q4 is by-passed to signal ground by capacitor C10; and its collector is coupled to the interconnected emitters of Q1 and Q2, not by direct connection, but rather by the emitter-to-collector path of a further common-base-amplifier NPN transistor Q5. Q5 is a part of a current splitting arrangement that includes D1, which current splitting arrangement is used to control the portion of the Q4 collector current to be withdrawn from the emitter of the one of transistors Q1 and Q2 selected for conduction, as will be presently explained.

The resistive potential divider action of resistors R10, R11 and R12 is used to develop appropriate base bias potentials for Q5 and Q4, these resistors apportioning the −15 VDC supply roughly equally between themselves. The base of Q5 is by-passed to signal ground by capacitor C11. The base bias applied to Q4 offsets its emitter about 4.7 volts from −15 VDC, and the resistor R13 connecting the emitter of Q4 to −15 VDC supply determines the quiescent emitter current of Q4 in accordance with Ohm's Law (to be about 1 mA. for R13 having a 4700 ohm resistance, as shown).

Q5, as noted above, is in current splitter arrangement with diode D1. The cathode of D1 connects to the same node as the emitter of Q5 and collector of Q4; and its anode is by-passed to signal ground via capacitor C12. An adjustable potential divider comprising resistor R14 and potentiometer P1 adjusts the direct potential at the anode of D1. As this potential is adjusted increasingly negativeward, the portion of the collector current of Q4 flowing as emitter current to Q5 is increased, to increase the amplitude of the signal current variations applied to the node at which the emitters of Q1 and Q2 interconnect. Consequently, signal gain to terminals OUT1 and OUT2 is increased. Conversely, adjusting the anode potential of D1 to less negative value increases the portion of the Q4 collector current diverted to diode D1 from the emitter of Q5 and decreases the amplitude of the signal-current variations applied to the node at which the emitters of Q1 and Q2 interconnect. Consequently, signal gain to terminals OUT1 and OUT2 is decreased.

Thus, the effective transconductance of transistor Q4 is controlled by the current splitting between transistor Q5 and diode D1. Alternatively, the collector of Q4 can be directly connected to the node at which the emitters of Q1 and Q2 interconnect, with the transconductance of Q4 being controlled in another way. This can be done, for example, by controlling the emitter current of Q4. In furtherance of this example, this current control can be effected by connecting Q4 in a current splitting arrangement to apportion the current flow through R13 between the emitter of Q4 and another semiconductor device. Arranging Q4 for constant quiescent current flow and splitting its collector current to reduce its effective transconductance, as shown, is preferred from the standpoint of presenting the capacitor transformer connection of C8 and C9 with more constant load impedance.

The transistors used in this circuitry are from a CA3045 integrated circuit array manufactured by RCA Corporation's Solid State Division, Somerville, N.J.

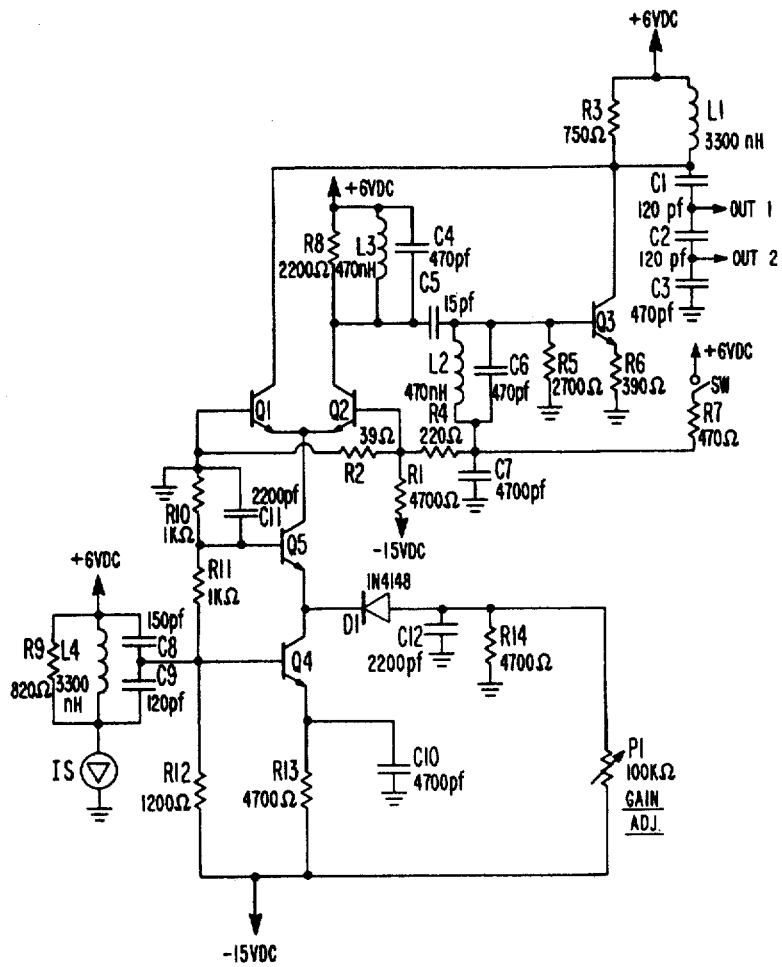

What is claimed is:

1. In a radar receiver intermediate-frequency amplifier a bandwidth control circuit comprising:

first and second transistors, each having base and emitter and collector electrodes;

a node at which the emitter electrodes of said first and second transistors connect;

means for applying a reference potential to the base electrode of one of said first and second transistors;

means for selectively applying one of first and second quiescent potentials to the base electrode of the other of said first and second transistors, said first and second quiescent potentials being of opposite polarities to each other as referred to said reference potential, for selecting the conduction of said first transistor for obtaining relatively wideband operation or for selecting conduction of said second transistor for obtaining relatively narrowband operation;

means for applying a unidirectional current with signal variations to said node, said unidirectional current of a polarity for implementing conduction by the selected one of said first and second transistors;

narrow-bandwidth filter means for receiving the collector current of said second transistor to respond with a narrow-bandwidth signal;

amplifier means for supplying from an output circuit thereof an output current exhibiting variations applied to an input circuit thereof responsive to said narrow-band signal; and wide-bandwidth filter means for receiving whichever of the collector current of said first transistor and the output current of said amplifier means is supplied, to respond with a bandwidth-controlled output signal.

2. A bandwidth control circuit as set forth in claim 1 wherein said reference potential is applied to the base electrode of said first transistor and wherein said amplifier means comprises:

a third transistor having an emitter electrode connected for operating said third transistor as a common-emitter amplifier, having a base electrode to which is selectively applied the same one of said first or second quiescent potentials as is selectively applied to the base electrode of said second transistor and to which said narrow-band signal is applied, and having a collector electrode connected like that of said first transistor to said wide-bandwidth filter means.

3. A bandwidth control circuit as set forth in claim 2 wherein said first or second quiescent potential is selectively applied to the base electrodes of said second and third transistors by means of respective potential dividers, dividing the selectively applied potential by different factors to provide the respective quiescent base potentials of said second and third transistors.

4. A bandwidth control circuit as set forth in claim 2 wherein said narrow-bandwidth filter means is a double-tuned filter with an input circuit receptive of the collector current of said second transistor and with an output circuit through which the first or second quiescent potential is selectively applied to the base electrode of said third transistor.

5. A bandwidth control circuit as set forth in claim 1, 2, or 4 wherein said means for applying a unidirectional current with signal variations to said node comprises:
a further transistor having a collector electrode connected to said node, having an emitter electrode by-passed for signal variations, and having a base electrode to which input signal is applied; and
means for controlling the effective transconductance of said further transistor.

6. A bandwidth control circuit as set forth in claim 5 wherein said means for controlling the effective transconductance of said further transistor includes:
a still further transistor having a base electrode biased to a potential between those at which the base electrodes of said first and further transistors are respectively biased, having a collector electrode connected to said node, and having an emitter electrode to which the collector electrode of said furter transistor connects, said still further transistor thereby being the means by which said further transistor collector electrode is connected to said node; and
a semiconductor junction having one end connected to the emitter electrode of said still further transistor, having a second end by-passed for signal variations and arranged to receive an adjustable forward-bias current which flows in the same direction as the emitter current of said still further transistor to the collector of said further transistor.

7. In a radar receiver intermediate-frequency amplifier a bandwidth control circuit for supplying its output signals with selected bandwidth to the input of a succeeding stage, said bandwidth control circuit comprising:
first and second transistors, each having base and emitter and collector electrodes;
a node at which the emitter electrodes of said first and second transistors connect;
means for applying a reference potential to the base electrode of one of said first and second transistors;
means for selectively applying one of first and second quiescent potentials to the base electrode of the other of said first and second transistors, said first and second quiescent potentials being of opposite polarities to each other as referred to said reference potential, for selecting the conduction of said first transistor for obtaining relatively wideband operation or for selecting conduction of said second transistor for obtaining relatively narrowband operation;
means for applying a unidirectional current with signal variations to said node, said unidirectional current of a polarity for implementing conduction by the selected one of said first and second transistors;
narrow-bandwidth filter means for receiving the collector current of said second transistor to respond with a narrow-bandwidth signal for application to the input of said succeeding stage; and
wide-bandwidth filter means for receiving the collector current of said first transistor to respond with a wide-bandwidth signal for application to the input of said succeeding stage.

* * * * *

UNITED STATES PATENT AND TRADEMARK OFFICE
CERTIFICATE OF CORRECTION

PATENT NO. : 4,371,846  Page 1 of 3
DATED : February 1, 1983
INVENTOR(S) : Edward B. Gamble It is certified that error appears in the above-identified patent and that said Letters Patent is hereby corrected as shown below:

The title page and sheet 1 of the drawing showing Fig. 1 should be deleted to appear as per attached sheets.

Signed and Sealed this

Twenty-ninth Day of November 1983

[SEAL]

Attest:

GERALD J. MOSSINGHOFF

Attesting Officer    Commissioner of Patents and Trademarks

United States Patent [19]

Gamble

[11] 4,371,846
[45] Feb. 1, 1983

[54] BANDWIDTH CONTROL CIRCUITRY FOR RADAR I-F AMPLIFIER

[75] Inventor: Edward B. Gamble, Granada Hills, Calif.

[73] Assignee: Sperry Corporation, New York, N.Y.

[21] Appl. No.: 201,825

[22] Filed: Oct. 29, 1980

[51] Int. Cl.³ ............................ H03H 3/68; H03G 3/30
[52] U.S. Cl. ......................................... 330/278; 330/126; 330/295; 330/306; 330/311; 455/266
[58] Field of Search ................. 330/126, 252, 254, 261, 330/295, 306, 311, 278; 328/105, 106; 455/191, 188, 266

[56] References Cited

U.S. PATENT DOCUMENTS

| | | | |
|---|---|---|---|
| 2,716,161 | 8/1955 | Gray | 455/188 X |
| 3,260,952 | 7/1966 | Kaye et al. | 330/285 |
| 3,581,222 | 5/1971 | Dunwoodie | 330/284 |
| 3,649,847 | 3/1972 | Limberg | 328/171 X |
| 3,684,974 | 8/1972 | Solomon et al. | 330/254 |
| 3,742,126 | 6/1973 | Altmanshofer | 178/5.4 R |
| 3,872,387 | 3/1975 | Banach | 455/266 X |
| 3,875,522 | 4/1975 | Hoefl | 330/254 |
| 4,041,409 | 8/1977 | Kominami et al. | 330/254 |

OTHER PUBLICATIONS

"RCA Primus-90 WXD Receiver-Transmitter MI-585161 Component Maintenance Manual IB8029066", Dec. 1, 1979, pp. 21-25, 147-148.

Primary Examiner—James B. Mullins
Attorney, Agent, or Firm—Howard P. Terry

[57] ABSTRACT

A unidirectional current with i-f variations superimposed thereon is applied to the interconnected emitters of a pair of transistors, the collectors of which are coupled to a succeeding stage by a narrow-band filter and by a wide-band filter respectively. The unidirectional current with i-f variations is amplified by a selected one of the transistors and filtered accordingly, depending upon which of two polarities of potential is applied between the bases of the transistors.

7 Claims, 1 Drawing Figure